(12) United States Patent
Lin et al.

(10) Patent No.: US 11,094,589 B2
(45) Date of Patent: Aug. 17, 2021

(54) MULTICOLOR SELF-ALIGNED CONTACT SELECTIVE ETCH

(71) Applicant: Applied Materials, Inc., Santa Clara, CA (US)

(72) Inventors: Yung-Chen Lin, Gardena, CA (US); Qingjun Zhou, San Jose, CA (US); Ying Zhang, Santa Clara, CA (US); Ho-yung David Hwang, Cupertino, CA (US)

(73) Assignee: Applied Materials, Inc., Santa Clara, CA (US)

(*) Notice: Subject to any disclaimer, the term of this patent is extended or adjusted under 35 U.S.C. 154(b) by 304 days.

(21) Appl. No.: 16/299,766

(22) Filed: Mar. 12, 2019

(65) Prior Publication Data
US 2019/0279901 A1   Sep. 12, 2019

Related U.S. Application Data

(60) Provisional application No. 62/641,993, filed on Mar. 12, 2018.

(51) Int. Cl.
*H01L 21/768* (2006.01)
*H01L 21/027* (2006.01)
*H01L 21/033* (2006.01)

(52) U.S. Cl.
CPC .... *H01L 21/76897* (2013.01); *H01L 21/0274* (2013.01); *H01L 21/0337* (2013.01); *H01L 21/76814* (2013.01); *H01L 21/76834* (2013.01)

(58) Field of Classification Search
None
See application file for complete search history.

(56) References Cited

U.S. PATENT DOCUMENTS

| | | |
|---|---|---|
| 9,899,321 B1 | 2/2018 | Park et al. |
| 2005/0098854 A1* | 5/2005 | Shima ................ H01L 29/1054 257/616 |
| 2014/0077305 A1 | 3/2014 | Pethe et al. |
| 2014/0110798 A1* | 4/2014 | Cai ..................... H01L 29/4966 257/410 |
| 2017/0194211 A1 | 7/2017 | Lai et al. |
| 2018/0061753 A1 | 3/2018 | Chang et al. |

FOREIGN PATENT DOCUMENTS

WO    2016160120 A1    10/2016

OTHER PUBLICATIONS

European Search Report in Application No. 19162014.5-1211, dated Aug. 1, 2019, 8 pages.

* cited by examiner

*Primary Examiner* — Mounir S Amer
(74) *Attorney, Agent, or Firm* — Servilla Whitney LLC

(57) ABSTRACT

Methods of forming and processing semiconductor devices which utilize the selective etching of aluminum oxide over silicon oxide, silicon nitride, aluminum oxide or zirconium oxide are described. Certain embodiments relate to the formation of self-aligned contacts for metal gate applications.

20 Claims, 2 Drawing Sheets

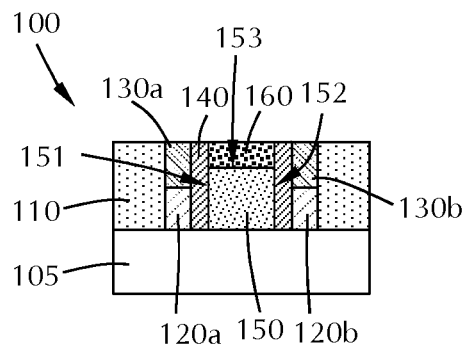
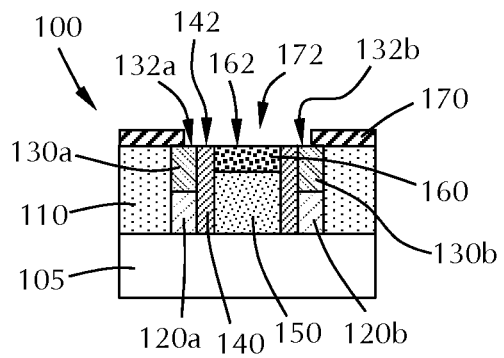
FIG. 1
FIG. 2
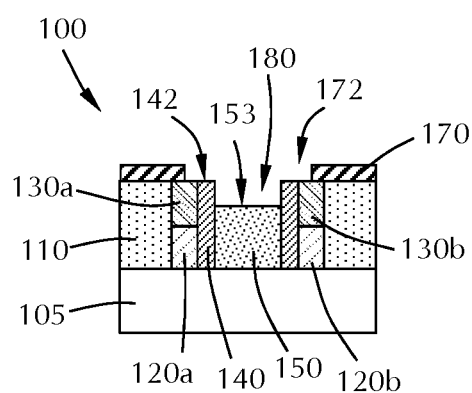
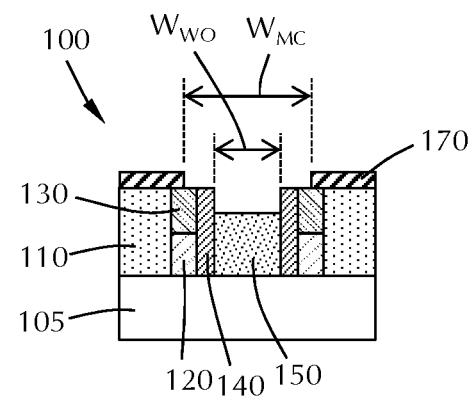
FIG. 3
FIG. 4

MULTICOLOR SELF-ALIGNED CONTACT SELECTIVE ETCH

CROSS-REFERENCE TO RELATED APPLICATIONS

This application claims priority to U.S. Provisional Application No. 62/641,993, filed Mar. 12, 2018, the entire disclosure of which are hereby incorporated by reference herein.

TECHNICAL FIELD

Embodiments of the present invention pertain to the field of electronic device manufacturing and methods for device patterning. In particular, embodiments pertain to the use of selective etching of aluminum oxide in patterning and gate contact applications.

BACKGROUND

Reducing the size of integrated circuits (ICs) results in improved performance, increased capacity and/or reduced cost. Each size reduction requires more sophisticated techniques to form the ICs. Photolithography is commonly used to pattern ICs on a substrate. An exemplary feature of an IC is a line of a material which may be a metal, semiconductor or insulator. Linewidth is the width of the line and the spacing is the distance between adjacent lines. Pitch is defined as the distance between a same point on two adjacent lines. The pitch is equal to the sum of the linewidth and the spacing. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quadruple patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease. Therefore the precision of mask edge placement control must be higher. For example, for a 7 nm node structure, the pitch is about 32 nm, and the cut or block mask's total edge placement errors (EPE) should be less than ¼ of the pitch, which is less than about 8 nm. Equipment capable of meeting such tight geometric requirements are extremely expensive, and additionally, such tight geometric requirements also contribute to low production yields.

Therefore, there is a need for improved methods for device patterning to reduce defects from pattern misalignment and increase production yields.

SUMMARY

One or more embodiments of the disclosure are directed to methods of forming a semiconductor device. A substrate with a gate with a first side and a second side and with a gate cap thereon is provided. The substrate has a spacer material adjacent the first side and the second side of the gate. The spacer material adjacent the first side of the gate is a first spacer and the spacer material adjacent the second side of the gate is a second spacer. A source material with a source cap is on an opposite side of the spacer material adjacent the first side of the gate. A drain material with a drain cap is on an opposite side of the spacer material adjacent the second side of the gate. A dielectric is on opposite sides of the source material from the first spacer and on opposite sides of the drain material from the second spacer. A mask is formed on a surface of the gate cap, spacer material, source cap, drain cap and dielectric. The mask has an opening exposing the surface of one or more of the gate cap, source cap or drain cap. One or more of the gate cap, source cap or drain cap is selectively etched through the opening in the mask to expose a top of one or more of the gate, source material or drain material forming a gap. At least one of the gate cap, source cap or drain cap comprises a material that is resistant to etching using the etch conditions for the selective etching.

Additional embodiments of the disclosure are directed to methods of forming a semiconductor device. A substrate with a gate with a first side and a second side and with a gate cap thereon is provided. The substrate has a spacer material adjacent the first side and the second side of the gate. The spacer material adjacent the first side of the gate is a first spacer and the spacer material adjacent the second side of the gate is a second spacer. A source material with a source cap is on an opposite side of the spacer material adjacent the first side of the gate. A drain material with a drain cap is on an opposite side of the spacer material adjacent the second side of the gate. A dielectric is on opposite sides of the source material from the first spacer and on opposite sides of the drain material from the second spacer. A mask is formed on a surface of the gate cap, spacer material, source cap, drain cap and dielectric. The mask has an opening exposing the surface of the gate cap and at least some of the surface of one or more of the source cap or drain cap. The gate cap is selectively etched through the opening in the mask to expose a top of one or more of the gate and leave substantially all of the source cap and drain cap.

Further embodiments of the disclosure are directed to methods of forming a semiconductor device. A substrate with a gate with a first side and a second side and with a gate cap thereon is provided. The substrate has a spacer material adjacent the first side and the second side of the gate. The spacer material adjacent the first side of the gate is a first spacer and the spacer material adjacent the second side of the gate is a second spacer. A source material with a source cap is on an opposite side of the spacer material adjacent the first side of the gate. A drain material with a drain cap is on an opposite side of the spacer material adjacent the second side of the gate. A dielectric is on opposite sides of the source material from the first spacer and on opposite sides of the drain material from the second spacer. A mask is formed on a surface of the gate cap, spacer material, source cap, drain cap and dielectric. The mask has an opening exposing the surface of one or more of the source cap or drain cap and at least some of the gate cap. One or more of the source cap or drain cap is selectively etched through the opening in the mask to expose a top of one or more of the source material or drain material and leave substantially all of the gate cap.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1 illustrates a cross-sectional view of an electronic device structure to provide aligned patterning according to one or more embodiment of the disclosure;

FIG. 2 illustrates a cross-sectional view of an electronic device structure after forming a mask with opening over a gate cap according to one or more embodiment of the disclosure;

FIG. 3 illustrates a cross-sectional view of an electronic device structure of FIG. 2 after selectively etching the gate cap according to one or more embodiment of the disclosure;

FIG. 4 shows a cross-sectional view of the electronic device structure of FIG. 3 with relative measurements comparing convention processes to the disclosed process;

DETAILED DESCRIPTION

Figure 5:
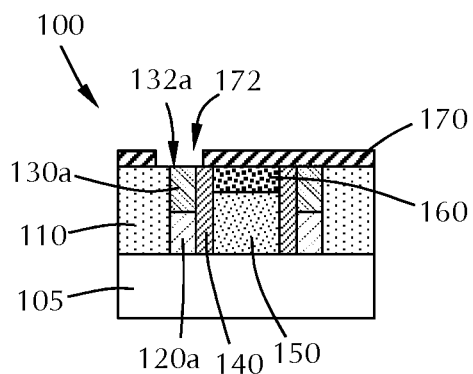
FIG. 5 illustrates a cross-sectional view of an electronic device structure after forming a mask with opening over a source cap according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in some embodiments" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

Edge Placement Error (EPE), for example, lithography overlay (OL), pitch walking, etc., make cutting schemes in patterning applications very challenging. Some embodiments of the disclosure advantageously provide methods to minimize or eliminate pattern misalignment. To maximize the density scaling and ease the specification margin of EPE, embodiments of the disclosure are directed to self-aligned schemes for sub N10 technologies.

The embodiments of the disclosure are described by way of the Figures which illustrate self-aligned etch processes in accordance with one or more embodiments of the disclosure as exemplary process flows using a two-color (AB) process. The term "two-color" refers to two different materials which are selectively etchable relative to each other. The processes shown are merely illustrative possible uses for the disclosed processes, and the skilled artisan will recognize that the disclosed processes are not limited to the illustrated applications.

One or more embodiments of the disclosure advantageously provide methods for forming self-aligned contacts that mitigate the impact of the pitch walking issue on EPE margins. Some embodiments advantageously provide superior etching selectively to achieve contact-over-active area layout design to increase density scaling. Some embodiments advantageously provide self-aligned schemes with high selective etch ability to improve production yield and device performance.

FIG. 1 illustrates an electronic device 100 in accordance with one or more embodiment of the disclosure. The electronic device 100 can be referred to as a metal gate, a transistor, a transistor gate, and the like. The electronic device 100 has a substrate 105 with a metal gate 150 formed thereon. The metal gate 150 has a first side 151 and a second side 152 on opposite sides of the metal gate 150. A gate cap 160 is formed on the top surface 153 of the metal gate 150.

The substrate 105 can be any suitable substrate material. In one or more embodiments, the substrate 105 comprises a semiconductor material, e.g., silicon (Si), carbon (C), germanium (Ge), silicon germanium (SiGe), gallium arsenide (GaAs), InP, InGaAs, InAlAs, other semiconductor material, or any combination thereof. In some embodiments, substrate 105 is a semiconductor-on-isolator (SOI) substrate including a bulk lower substrate, a middle insulation layer, and a top monocrystalline layer. The top monocrystalline layer may comprise any material listed above, e.g., silicon. In various embodiments, the substrate 105 can be, e.g., an organic, a ceramic, a glass, or a semiconductor substrate. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

Spacers 140 are formed adjacent the first side 151 and the second side 152 of the gate 150 and gate cap 160. The spacers 140 on either side of the gate 150 can be the same material or different materials. The spacer 140 adjacent the first side 151 of the gate 150 can be referred to as the first spacer 140 and the spacer 140 adjacent the second side 152 of the gate 150 can be referred to as the second spacer 140.

A source material 120a with a source cap 130a is formed on an opposite side of the first spacer 140 adjacent the first side 151 of the gate 150 and a drain material 120b with a drain cap 130b is formed on an opposite side of the second spacer 140 adjacent the second side 152 of the gate 150. A dielectric 110 is formed around the source/drain 120a, 120b and the metal gate 150. The dielectric is formed on opposite sides of the source material 120a and the drain material 120b from the spacer 140. The individual components of the electronic device 100 can be formed by any suitable process or processes known to the skilled artisan.

The gate 150 can be made of any suitable material known to the skilled artisan. The spacer 140 of some embodiments comprises a low-k material. In some embodiments, the low-k material is selected from SiOC or SiONC. The source and drain materials can be any suitable material known to the skilled artisan. In some embodiments, the source material comprises cobalt, or a doped cobalt. In some embodiments, the drain material comprises cobalt or a doped cobalt. The dielectric 110 of some embodiments comprises a flowable silicon oxide film.

In some embodiments, the gate cap 160, source cap 130a and/or drain cap 130b comprises a material that can be selectively etched. Stated differently, at least one of the gate cap 160, source cap 130a or drain cap 130b comprising a different material than at least one of the other of the gate cap 160, source cap 130a or drain cap 130b. For example, if the gate cap 160 is being removed, the gap cap 160 comprises a material that is etched more easily than the material of the source cap 130a or drain cap 130b. In some embodiments, each of the gate cap 160, source cap 130a and drain cap 130b are selected from the group consisting of aluminum oxide ($Al_2O_3$), silicon nitride ($Si_3N_4$) or zirconium oxide ($ZrO_2$). The skilled artisan will recognize that the various cap materials may not have stoichiometric amounts of the elements specified and that the formulae for aluminum oxide, silicon nitride and zirconium oxide are merely exemplary. In some embodiments, the cap(s) to be removed comprises (or consists essentially of) silicon nitride and the cap(s) to remain comprises one or more of aluminum oxide or zirconium oxide. In some embodiments, the cap(s) to be removed comprises (or consists essentially of) aluminum oxide and the cap(s) to remain comprises one or more of silicon nitride or zirconium oxide. In some embodiments, the cap(s) to be removed comprises (or consists essentially of) zirconium oxide and the cap(s) to remain comprises one or more of aluminum oxide or silicon nitride. As used in this manner, the term "consists essentially of" means that the specified cap material is greater than or equal to about 95%, 98% or 99% of the stated material, on an atomic basis. In some embodiments, at least one of the gate cap 160, source cap 130a or drain cap 130b comprises a material that is resistant to etching using the etch conditions for the selective etching process.

FIG. 2 shows the electronic device 100 after forming a mask 170 on the surface 162 of the gate cap 160, the surface 142 of the spacer material 140, the surface 132a of the source cap 130a and the surface 132b of the drain cap 130b. The mask 170 has an opening 172 that exposes the surfaces of one or more of the gate cap 160, source cap 130a or drain cap 130b.

In the embodiment illustrated in FIG. 2, the opening 172 is located primarily over the gate cap 160 exposing the surface 162 thereof. The surface 142 of the spacer material 140 on either side of the gate 150 is exposed through the opening 172. At least some of the surface 132a of the source cap 130a and at least some of the surface 132b of the drain cap 130b is also exposed. The illustrated embodiment is merely exemplary of one possible arrangement for the opening 172 in the mask 170. In some embodiments, the surface 162 of the gate cap 160 is completely exposed through the opening 172 in the mask 170. The skilled artisan will recognize that the Figures show a cross sectional view of the electronic device 100 and will recognize that completely exposing the stated surface is relative to the cross-section taken through the mask opening. In some embodiments, the opening 172 eposes the surface 162 of the gate cap 160 and some of the surface 142 of the spacer material 140. In some embodiments, the opening 172 exposes the surface 162 of the gate cap 160, the surface 142 of the spacer materials 140 on either side of the gate 150, the surface 132a of the source cap 130a, the surface 132b of the drain cap 130b and portions of the surface of the dielectric 110.

Figure 6:
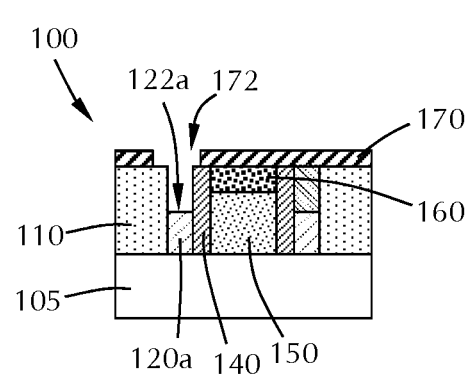
FIG. 6 illustrates a cross-sectional view of an electronic device structure of FIG. 5 after selectively etching the gate cap according to one or more embodiment of the disclosure.
Figure 7:
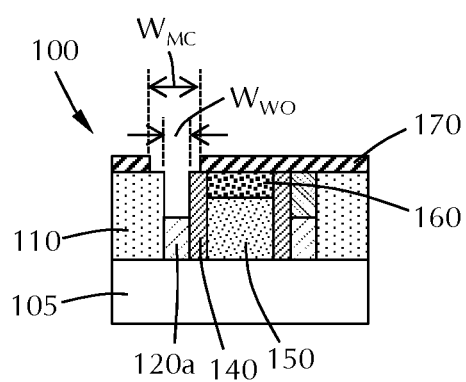
FIG. 7 shows a cross-sectional view of the electronic device structure of FIG. 6 with relative measurements comparing convention processes to the disclosed process.

The embodiment illustrated in FIGS. 2 through 4 are representative of a gate cap etch process. The embodiment illustrated in FIGS. 5 through 7 are representative of a source/drain cap etch process and are described below.

The mask 170 can be any suitable mask material known to the skilled artisan. In some embodiments, the mask 170 comprises a spin-on carbon layer, hardmask and photoresist. In one embodiment, mask 170 is a tri-layer mask stack, e.g., a 193 nm immersion (193i) or EUV resist mask on a middle layer (ML) (e.g., a silicon containing organic layer or a metal containing dielectric layer) on a bottom anti-reflective coating (BARC) layer on a silicon oxide hard mask. In some embodiments, formation of the mask 170 comprises forming a spin-on-carbon (SOC) film with a hardmask and a photoresist thereon. The photoresist has an opening positioned in the location to be etched and the opening can be extended through the SOC film and the hardmask to form opening 172 in mask 170. The hardmask and photoresist can be any suitable material. In one embodiment, mask is a metallization layer hard mask. In some embodiments, mask 170 includes a titanium nitride (TiN) layer, a tungsten carbide (WC) layer, a tungsten bromide carbide (WBC) layer, carbon hard mask, a metal oxide hard mask layer, a metal nitride hard mask layer, a silicon nitride hard mask layer, a silicon oxide hard mask layer, a carbide hard mask layer, or other hard mask layer known to one of ordinary skill in the art of microelectronic device manufacturing. In one embodiment, the mask 170 is formed using one or more hard mask patterning techniques known to one of ordinary skill in the art of microelectronic device manufacturing.

In one embodiment, the photoresist is deposited using one or more mask layer deposition techniques known to one of ordinary skill in the art of microelectronic device manufacturing. In one embodiment, photoresist is deposited using one of deposition techniques, such as but not limited to a CVD, PVD, MBE, NOCVD, spin-on, or other insulating layer deposition techniques known to one of ordinary skill in the art of microelectronic device manufacturing. In one embodiment, the opening is formed using one or more of the patterning and etching techniques known to one of ordinary skill in the art of microelectronic device manufacturing.

After formation of the mask 170 with the opening 172, one or more of the gate cap 160, source cap 130a or drain cap 130b can be selectively etched to expose the top surface of one or more of the gate 150, source material 120a or drain material 120b. The selectivity of an etching process is generally expressed as a ratio of etch rates. For example, if one material (e.g. aluminum oxide) is etched 25 times faster than other materials, the process would be described as having a selectivity of 25:1 or simply 25. In this regard, higher ratios/values indicate more selective etch processes. In some embodiments, the selective etch process which removes the gapfill material 80 has a selectivity greater than or equal to about 10, greater than or equal to about 12, greater than or equal to about 15, greater than or equal to about 20, or greater than or equal to about 25. In some embodiments, the selective etch process has a selectivity of about 12.

In the embodiment illustrated in FIG. 3, the gate cap 160 has been removed by the selective etch process to expose the top surface 153 of the gate 150 forming a gap 180. In some embodiments, substantially all of the source cap 130a and the drain cap 130b remain after etching the gate cap 160. As used in this manner, the term "substantially all" means that less than or equal to about 50%, 20%, 10%, 5%, 2% or 1% of the cap material remains, based on the initial thickness of the cap material.

As illustrated in FIG. 4, the selective etch process described allows for less stringent control of the exact size of the opening 172 in the mask 170 so that overlap with the caps not being removed will not detract from the device performance. In a conventional process, the opening 172 in the mask 170 is sized to match the width of the gate cap, as illustrated in width $W_{WO}$. However, in the illustrated process, the width $W_{MC}$ of the opening 172 can be much larger and the particular location of the edges of the opening can be loosely controlled.

FIGS. 5 through 7 illustrate a source/drain cap removal process. In FIG. 5, the opening 172 in the mask 170 is positioned to expose the surface 132a of the source cap 130a. While not illustrated separately, the skilled artisan will recognize the analogous process to remove the drain cap 130b by positioning the opening 172 to expose the surface 132b of the drain cap 130b. The opening 172 in the mask 170 is larger than the surface 132a of the source cap 130a so that the surface of the dielectric 110 is at least partially exposed and the surface of spacer material 140 is at least partially exposed. In some embodiments, the surface of the spacer material 140 is exposed and at least some of the surface of the gate cap 160 is exposed through the opening 172.

FIG. 6 illustrates the electronic device 100 of FIG. 5 after the source cap 130a has been selectively etched, leaving the adjacent films (i.e., dielectric 110 and spacer material 140) substantially unaffected. The surface 122a of the source material 120a is exposed through the gap formed by the etch process.

As illustrated in FIG. 7, the selective etch process described allows for less stringent control of the exact size of the opening 172 in the mask 170 so that overlap with the caps not being removed will not detract from the device performance. In a conventional process, the opening 172 in the mask 170 is sized to match the width of the source/drain cap, as illustrated in width $W_{WO}$. However, in the illustrated process, the width $W_{MC}$ of the opening 172 can be much larger and the particular location of the edges of the opening can be loosely controlled.

Although not illustrated, after removal of the cap by the selective etch process, additional material (e.g., a metal contact) may be deposited on top of the exposed surface. In some embodiments, the additional material comprises or consists essentially of one or more of copper or cobalt metal.

A gapfill material can be deposited on the exposed surface in the gap. The gapfill material can be deposited in a sufficient amount to form an overburden that covers the surfaces of the films adjacent to the gap (e.g., the dielectric 110 and spacer material 140 shown in FIG. 6). The gapfill material can be deposited by any suitable technique. In some embodiments, the gapfill material is deposited by atomic layer deposition.

The overburden can be removed to leave the top of the gapfill material even with the surface of the adjacent films. The overburden can be removed by a chemical-mechanical planarization process or by an etchback process.

In some embodiments, the mask 170 is removed by any suitable mask removal process known to the skilled artisan. The mask 170 can be removed before or after deposition of additional material in the gap formed by the selective etch process.

In the foregoing specification, embodiments of the invention have been described with reference to specific exemplary embodiments thereof. It will be evident that various modifications may be made thereto without departing from the broader spirit and scope of the embodiments of the invention as set forth in the following claims. The specification and drawings are, accordingly, to be regarded in an illustrative sense rather than a restrictive sense.

What is claimed is:

1. A method of forming a semiconductor device, the method comprising:

providing a substrate having a gate with a first side and a second side and with a gate cap thereon, the substrate having a spacer material adjacent the first side and the second side of the gate, the spacer material adjacent the first side of the gate is a first spacer and the spacer material adjacent the second side of the gate is a second spacer, a source material with a source cap is on an opposite side of the spacer material adjacent the first side of the gate, a drain material with a drain cap is on an opposite side of the spacer material adjacent the second side of the gate, and a dielectric on opposite sides of the source material from the first spacer and on opposite sides of the drain material from the second spacer;

forming a mask on a surface of the gate cap, spacer material, source cap, drain cap and dielectric, the mask having an opening exposing the surface of one or more of the gate cap, source cap or drain cap, the opening having a width greater than a width of one or more of the gate cap, source cap or drain cap; and selectively etching one or more of the gate cap, source cap or drain cap through the opening in the mask to expose a top of one or more of the gate, source material or drain material forming a gap, wherein at least one of the gate cap, source cap or drain cap comprises a material that is resistant to etching using the etch conditions for the selective etching.

2. The method of claim 1, wherein the gate comprises a metal.

3. The method of claim 1, wherein each of the gate cap, source cap and drain cap are selected from the group consisting of $Si_3N_4$, $Al_2O_3$ or $ZrO_2$, at least one of the gate cap, source cap or drain cap comprising a different material than at least one of the other of the gate cap, source cap or drain cap.

4. The method of claim 1, wherein the dielectric comprises a flowable silicon oxide.

5. The method of claim 1, wherein the source material comprises cobalt.

6. The method of claim 1, wherein the drain material comprises cobalt.

7. The method of claim 1, wherein the opening in the mask is formed over the gate cap and at least some of one or more of the source cap or drain cap.

8. The method of claim 1, wherein the opening in the mask is formed over one or more of the source cap or drain cap and at least some of the gate cap.

9. The method of claim 1, wherein the spacer material comprises a low-k dielectric.

10. The method of claim 9, wherein the low-k dielectric comprises one or more of SiOC or SiOCN .

11. The method of claiml, wherein the mask comprises a spin-on carbon layer, hardmask and photoresist.

12. The method of claim 1, further comprising removing the mask.

13. The method of claim 1, further comprising depositing a film in the gap.

14. The method of claim 1, wherein the selective etching is performed by an etch process with a selectivity greater than or equal to about 12.

15. A method of forming a semiconductor device, the method comprising:
providing a substrate having a gate with a first side and a second side and with a gate cap thereon, the substrate having a spacer material adjacent the first side and the second side of the gate, the spacer material adjacent the first side of the gate is a first spacer and the spacer material adjacent the second side of the gate is a second spacer, a source material with a source cap is on an opposite side of the spacer material adjacent the first side of the gate, a drain material with a drain cap is on an opposite side of the spacer material adjacent the second side of the gate, and a dielectric on opposite sides of the source material from the first spacer and on opposite sides of the drain material from the second spacer;
forming a mask on a surface of the gate cap, spacer material, source cap, drain cap and dielectric, the mask having an opening exposing the surface of the gate cap and at least some of the surface of one or more of the source cap or drain cap, the opening having a width larger than a width of one or more of the gate cap, source cap or drain cap; and
selectively etching the gate cap through the opening in the mask to expose a top of one or more of the gate and leave substantially all of the source cap and drain cap.

16. The method of claim 15, wherein each of the gate cap, source cap and drain cap are selected from the group consisting of $Si_3N_4$, $Al_2O_3$ or $ZrO_2$, the gate cap comprising a different material than one or more of the source cap or drain cap.

17. The method of claim 15, wherein the mask comprises a spin-on carbon layer, hardmask and photoresist.

18. A method of forming a semiconductor device, the method comprising:
providing a substrate having a gate with a first side and a second side and with a gate cap thereon, the substrate having a spacer material adjacent the first side and the second side of the gate, the spacer material adjacent the first side of the gate is a first spacer and the spacer material adjacent the second side of the gate is a second spacer, a source material with a source cap is on an opposite side of the spacer material adjacent the first side of the gate, a drain material with a drain cap is on an opposite side of the spacer material adjacent the second side of the gate, and a dielectric on opposite sides of the source material from the first spacer and on opposite sides of the drain material from the second spacer;
forming a mask on a surface of the gate cap, spacer material, source cap, drain cap and dielectric, the mask having an opening exposing the surface of one or more of the source cap or drain cap and at least some of the gate cap, the opening having a width larger than a width of one or more of the source cap or drain cap and at least some of the gate cap; and
selectively etching one or more of the source cap or drain cap through the opening in the mask to expose a top of one or more of the source material or drain material and leave substantially all of the gate cap.

19. The method of claim 18, wherein each of the gate cap, source cap and drain cap are selected from the group consisting of $Si_3N_4$, $Al_2O_3$ or $ZrO_2$, the gate cap comprising a different material than one or more of the source cap or drain cap.

20. The method of claim 18, wherein the mask comprises a spin-on carbon layer, hardmask and photoresist.

* * * * *

UNITED STATES PATENT AND TRADEMARK OFFICE
CERTIFICATE OF CORRECTION

Page 1 of 1

PATENT NO. : 11,094,589 B2
APPLICATION NO. : 16/299766
DATED : August 17, 2021
INVENTOR(S) : Yung-Chen Lin et al.

It is certified that error appears in the above-identified patent and that said Letters Patent is hereby corrected as shown below:

In the Claims

Column 9, Claim 11, Line 25, replace "claim1" with "claim 1" after "The method of".

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*